(12) United States Patent
Edwards

(10) Patent No.: US 7,290,201 B1
(45) Date of Patent: Oct. 30, 2007

(54) SCHEME FOR ELIMINATING THE EFFECTS OF DUTY CYCLE ASYMMETRY IN CLOCK-FORWARDED DOUBLE DATA RATE INTERFACE APPLICATIONS

(75) Inventor: Gareth D. Edwards, Edinburgh (GB)

(73) Assignee: XILINX, Inc., San Jose, CA (US)

( * ) Notice: Subject to any disclaimer, the term of this patent is extended or adjusted under 35 U.S.C. 154(b) by 576 days.

(21) Appl. No.: 10/706,813

(22) Filed: Nov. 12, 2003

(51) Int. Cl.
*G06F 11/00* (2006.01)
*G06F 1/06* (2006.01)

(52) U.S. Cl. .................. 714/798; 714/707; 714/34; 713/500

(58) Field of Classification Search ............... 714/798, 714/34, 707, 716, 717, 731, 744, 759, 775; 713/500, 401, 322
See application file for complete search history.

(56) References Cited

U.S. PATENT DOCUMENTS

| | | | | |
|---|---|---|---|---|
| 5,881,271 | A * | 3/1999 | Williams ................... | 713/401 |
| 6,049,883 | A * | 4/2000 | Tjandrasuwita ............. | 713/322 |
| 7,034,596 | B2 * | 4/2006 | Andrews et al. ............ | 327/257 |
| 2004/0243874 | A1 * | 12/2004 | Byers et al. ................ | 713/500 |

OTHER PUBLICATIONS

Xilinx, Inc., "Logicore," Sp1-4.2 Core v6.0.1, Product Specification DS209, Oct. 10, 2003, pp. 1-97, available from Xilinx, Inc., 2100 Logic Drive, San Jose, CA 95124.

Xilinx, Inc., "644-MHz SDR LVDS Transmitter/Receiver," Application Note: Virtex-II Series, XAPP622, Nov. 5, 2003, v1.5, available from Xilinx, Inc., 2100 Logic Drive, San Jose, CA 95124.

Rhodes, Martin; "XGMII Using the DDR Registers, DCM and SelectI/O-Ultra Features", XAPP606, Jul. 10, 2002, pp. 1-11, v1.1, available from Xilinx, Inc., 2100 Logic Drive, San Jose, CA 95124.

* cited by examiner

*Primary Examiner*—Guy Lamarre
*Assistant Examiner*—Fritz Alphonse
(74) *Attorney, Agent, or Firm*—E. Eric Hoffman; LeRoy D. Maunu

(57) ABSTRACT

A clock management system receives an input clock signal having rising edges and falling edges, a first set of data values associated with the rising edges of the input clock signal, and a second set of data values associated with the falling edges of the input clock signal. The clock management system provides a first clock and a second clock in response to the input clock signal. The first clock has a first set of edges that are synchronous with the rising edges of the input clock signal. The second clock has a second set of edges that are synchronous with the falling edges of the input clock signal. The first set of data values are latched in response to the first set of edges of the first clock. The second set of data values are latched in response to the second set of edges of the second clock.

22 Claims, 7 Drawing Sheets

SCHEME FOR ELIMINATING THE EFFECTS OF DUTY CYCLE ASYMMETRY IN CLOCK-FORWARDED DOUBLE DATA RATE INTERFACE APPLICATIONS

FIELD OF THE INVENTION

The present invention relates to a method and apparatus that enables data to be more reliably received in clock-forwarded double data rate interface applications.

RELATED ART

Inbound clock and data streams in the latest parallel double data rate (DDR) input/output (I/O) protocols, such as the 10-Gigabit Media Independent Interface (XGMII), have a level of permitted duty cycle asymmetry. Since these protocols carry information on both clock edges, this asymmetry directly affects the timing budget for an interface in a design. Typically, a digital clock manager (DCM) filters out the duty cycle asymmetry on the inbound clock signal. An example of such a DCM is present in the Virtex-II™ field programmable gate array (FPGA) family, available from Xilinx, Inc., 2100 Logic Drive, San Jose, Calif. 95124, and described in the Virtex-II™ Platform FPGA Handbook. However, the DCM does not affect the asymmetry in the associated inbound data stream. Consequently, the clock/data alignment at the clock falling edges will be degraded.

FIG. 1 is a block diagram of a clock management system 100 configured to receive data from a clock-forwarded source-synchronous and source-centered data bus. Clock management system 100 receives data (XGMII_RX_DATA) and a clock signal (XGMII_RX_CLK) from an XGMII bus. As is known to those of ordinary skill in the art, the XGMII timing specification is adapted from IEEE 802.3ae-2002.

The received data XGMII_RX_DATA is routed through data buffer 101 to the input terminals of input flip-flops 111-112. The received clock signal XGMII_RX_CLK is routed through clock buffer 102 to the clock input terminal of DCM 113. In response, DCM 113 provides an output clock signal $CLK_{OUT}$, which is routed through clock buffer 103 to the inverting clock input terminal of flip-flop 111, the non-inverting clock input terminal of flip-flop 112, and a feedback input terminal of DCM 113.

FIG. 2 is a waveform diagram illustrating the timing of the received clock signal XGMII_RX_CLK and the received data XGMII_RX_DATA. FIG. 2 illustrates that the received clock signal XGMII_RX_CLK has a nominal period of 6400 picoseconds (ps). The received data XGMII_RX_DATA is only guaranteed to be valid, at best, 480 picoseconds (ps) from each of the rising and falling edges of the received clock signal XGMII_RX_CLK.

Moreover, the duty cycle of the received clock signal XGMII_RX_CLK can vary such that the minimum pulse width of either polarity of the received clock signal XGMII_RX_CLK is 2500 ps (39% to 61% duty cycle).

As described below, with duty cycle correction enabled within DCM 113, the clock signal $CLK_{OUT}$ supplied by DCM 113 will have a nominal 50—50 duty cycle, regardless of the duty cycle of the received clock signal XGMII_RX_CLK.

FIG. 3 is a waveform diagram illustrating the timing of clock management system 100 if the received clock signal XGMII_RX_CLK and the associated data XGMII_RX_DATA each have a perfect 50—50 duty cycle. In this case, the inbound data XGMII_RX_DATA will be successfully clocked into the input flip-flops 111-112, because the data aligns with the edges of the received clock signal XGMII_RX_CLK.

FIG. 4 is a waveform diagram illustrating the timing of clock management system 100 if the received clock signal XGMII_RX_CLK and the associated data XGMII_RX_DATA are at the limits of the XGMII duty cycle specification. In this case, the falling edge of the received clock signal XGMII_RX_CLK occurs 2500 ps after the rising edge of the received clock signal. The associated data value (e.g., D1) is valid during the time period between 2020 ps (2500 ps−480 ps) and 2580 ps (2500 ps+480 ps) after the rising edge of the received clock signal XGMII_RX_CLK.

However, the duty cycle correction performed by DCM 113 causes the output clock signal $CLK_{OUT}$ to have a 50—50 duty cycle. DCM 113 therefore infers the position of the falling edge of the received clock signal XGMII_RX_CLK from its rising edge, rather than the actual position of the falling edge. More specifically, DCM 113 causes the falling edge of the $CLK_{OUT}$ signal to occur at a time that is halfway between successive rising edges of the received clock signal XGMII_RX_CLK. Thus, for a clock period of 6400 ps, the falling edge of the $CLK_{OUT}$ signal occurs 3200 ps after each rising edge of the received clock signal XGMII_RX_CLK. Because the data values associated with the falling edges of the received clock signal XGMII_RX_CLK (e.g., D1, D3 and D5) are only valid until 2980 ps (2500 ps+480 ps) after the rising edges of the received clock signal XGMII_RX_CLK, these data values (e.g., D1, D3 and D5), are not clocked into flip-flop 111.

It would therefore be desirable to have a clock management system that is capable of reliably receiving data on both edges of the received clock signal.

SUMMARY

Accordingly, the present invention provides a second clock management circuit in parallel with a first clock management circuit to handle the falling edge transitions of the received clock signal. Separating the handling of the rising and falling edges of the received clock signal provides two frequency-related but phase-independent clock signals to be used for the device input registers. This eliminates the contribution of duty cycle asymmetry from the receiver timing budgets.

More specifically, the present invention includes a clock management system that receives: an input clock signal having rising edges and falling edges, a first set of data values associated with the rising edges of the input clock signal, and a second set of data values associated with the falling edges of the input clock signal. A first digital clock manager provides a first clock signal in response to the input clock signal. The first clock signal has a first set of edges that are synchronous with the rising edges of the input clock signal. A second digital clock manager provides a second clock signal in response to the input clock signal. The second clock signal has a second set of edges that are synchronous with the falling edges of the input clock signal. The first set of data values are latched in response to the first set of edges of the first clock. The second set of data values are latched in response to the second set of edges of the second clock. As a result, an asymmetric duty cycle in the input clock signal does not adversely affect the latching of data values.

The present invention will be more fully understood in view of the following description and drawings.

DETAILED DESCRIPTION

Figure 5:
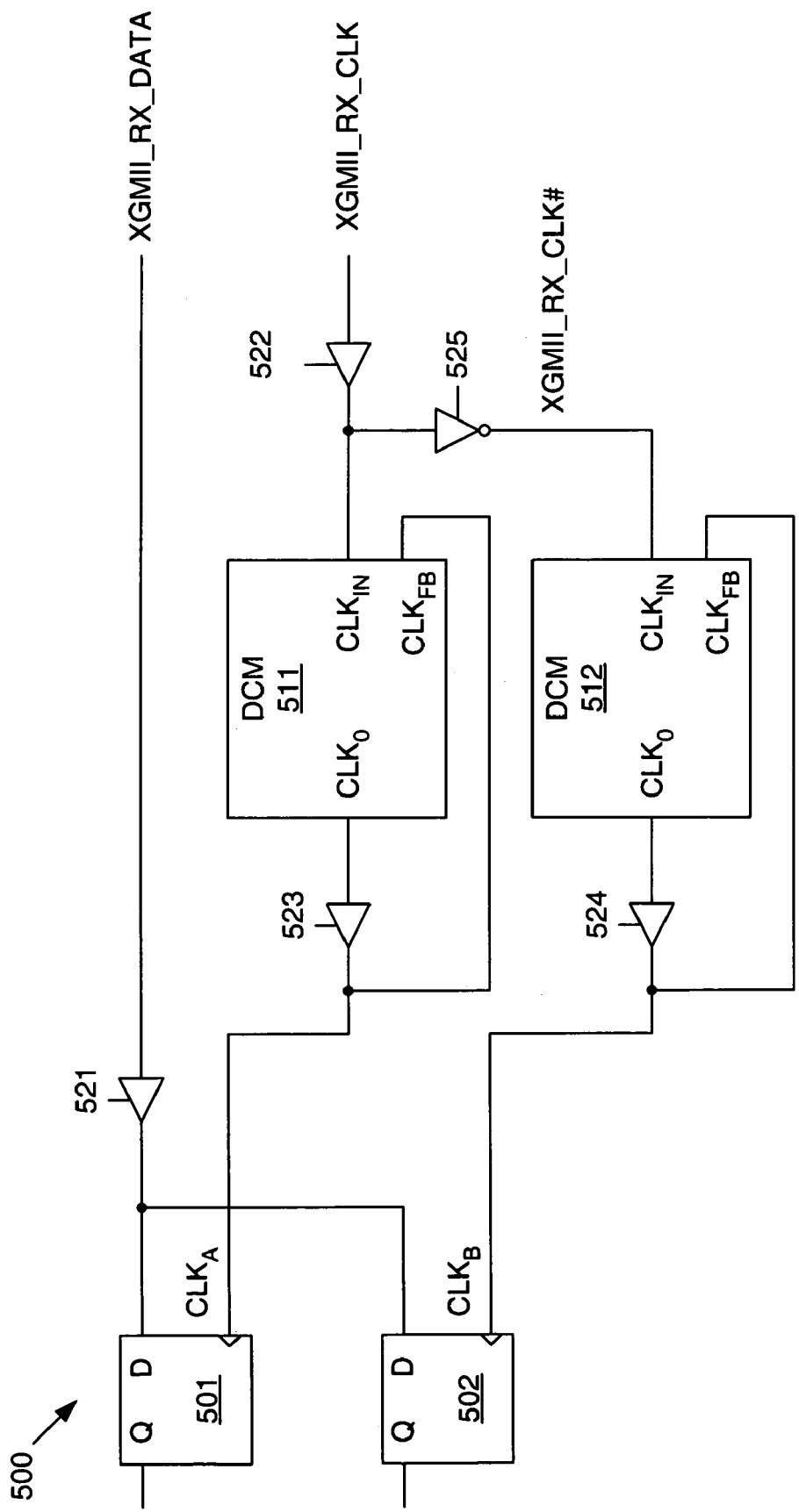
FIG. 5 is a block diagram of a clock management circuit in accordance with one embodiment of the present invention.

FIG. 5 is a block diagram of a clock management circuit 500 in accordance with one embodiment of the present invention. Clock management circuit 500 includes input flip-flops 501–502, DCMs 511–512, non-inverting buffers 521–524 and inverting buffer 525. An input data value XGMII_RX_DATA is received by buffer 521, which provides this data value to data input terminals of input flip-flops 501 and 502. The associated input clock signal XGMII_RX_CLK is received by buffer 522, which provides this clock signal to the input clock terminal $CLK_{IN}$ of DCM 511. In response, DCM 511 provides an output clock signal on output terminal $CLK_O$. This output clock signal is routed through non-inverting buffer 523 as the clock signal $CLK_A$. This clock signal $CLK_A$ is provided to the clock input terminal of input flip-flop 501 and to the feedback clock input terminal $CLK_{FB}$ of DCM 511.

DCM 511 causes the rising edges of the output clock signal $CLK_A$ to be synchronous with the rising edges of the input clock signal XGMII_RX_CLK. The input data XGMII_RX_DATA is latched into input flip-flop 501 on each rising edge of the clock signal $CLK_A$.

Inverting buffer 525 receives the input clock signal XGMII_RX_CLK from buffer 521, and in response, provides an inverted clock signal XGMII_RX_CLK# to the input terminal $CLK_{IN}$ of DCM 512. In response, DCM 512 provides an output clock signal on output terminal $CLK_O$. This output clock signal is routed through non-inverting buffer 524 as the clock signal $CLK_B$. This clock signal $CLK_B$ is provided to the clock input terminal of input flip-flop 502 and to the feedback clock input terminal $CLK_{FB}$ of DCM 512.

DCM 512 causes the rising edges of the output clock signal $CLK_B$ to be synchronous with the rising edges of the input clock signal XGMII_RX_CLK#. The input data XGMII_RX_DATA is latched into input flip-flop 502 on each rising edges of the clock signal $CLK_B$.

Figure 6:
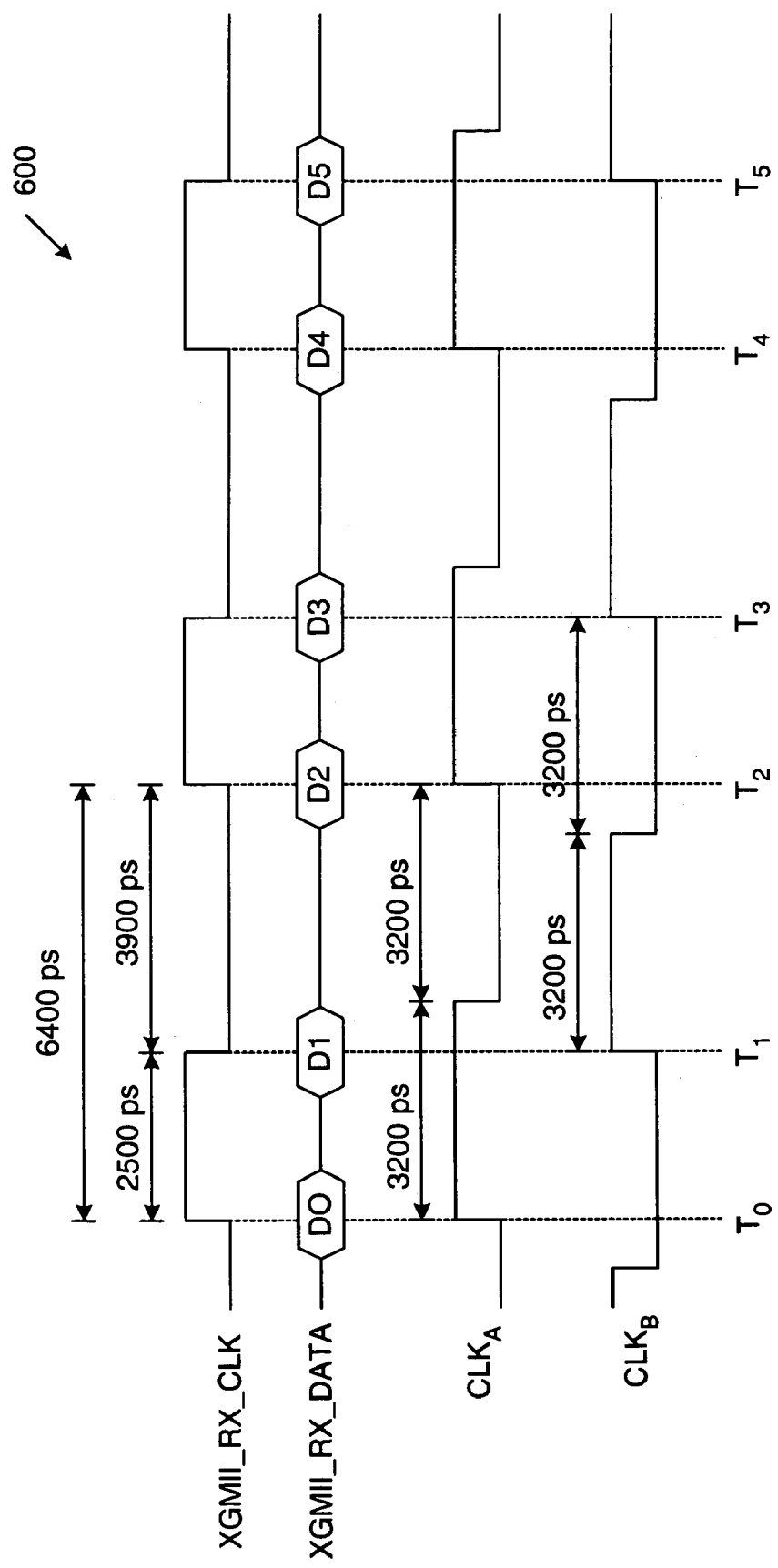
FIG. 6 is a waveform diagram illustrating the operation of the clock management circuit of FIG. 5, when the input clock signal and the associated input data values exhibit an asymmetric duty cycle.

FIG. 6 is a waveform diagram 600 illustrating the operation of system 500, when the input clock signal XGMII_RX_CLK and the associated input data values D0–D5 exhibit an asymmetric duty cycle. Note that the rising edges of input clock $CLK_B$ are directly derived from the falling edges of the input clock signal XGMII_RX_CLK, rather than being inferred as being 50% of a cycle after the rising edge of the input clock signal XGMII_RX_CLK. This advantageously eliminates the duty cycle asymmetry from the timing budget of clock management system 500. Moreover, DCM 512 advantageously tracks and corrects long-term changes in the duty cycle of the input clock signal XGMII_RX_CLK.

More specifically, at time $T_0$, the rising edge of the $CLK_A$ signal is synchronous with the rising edge of the input clock signal XGMII_RX_CLK. As a result, the data value D0 is reliably latched into flip-flop 501 in response to the rising edge of the $CLK_A$ signal.

Figure 1:
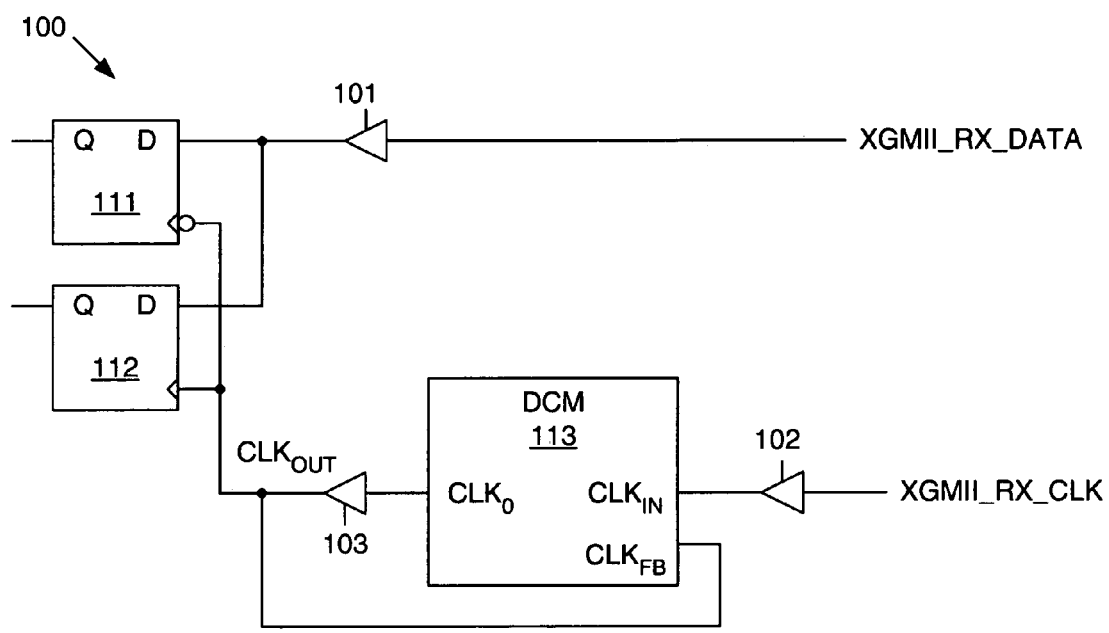
FIG. 1 is a block diagram of a conventional clock management system configured to receive data from a clock-forwarded source-synchronous and source-centered data bus.
Figure 2:
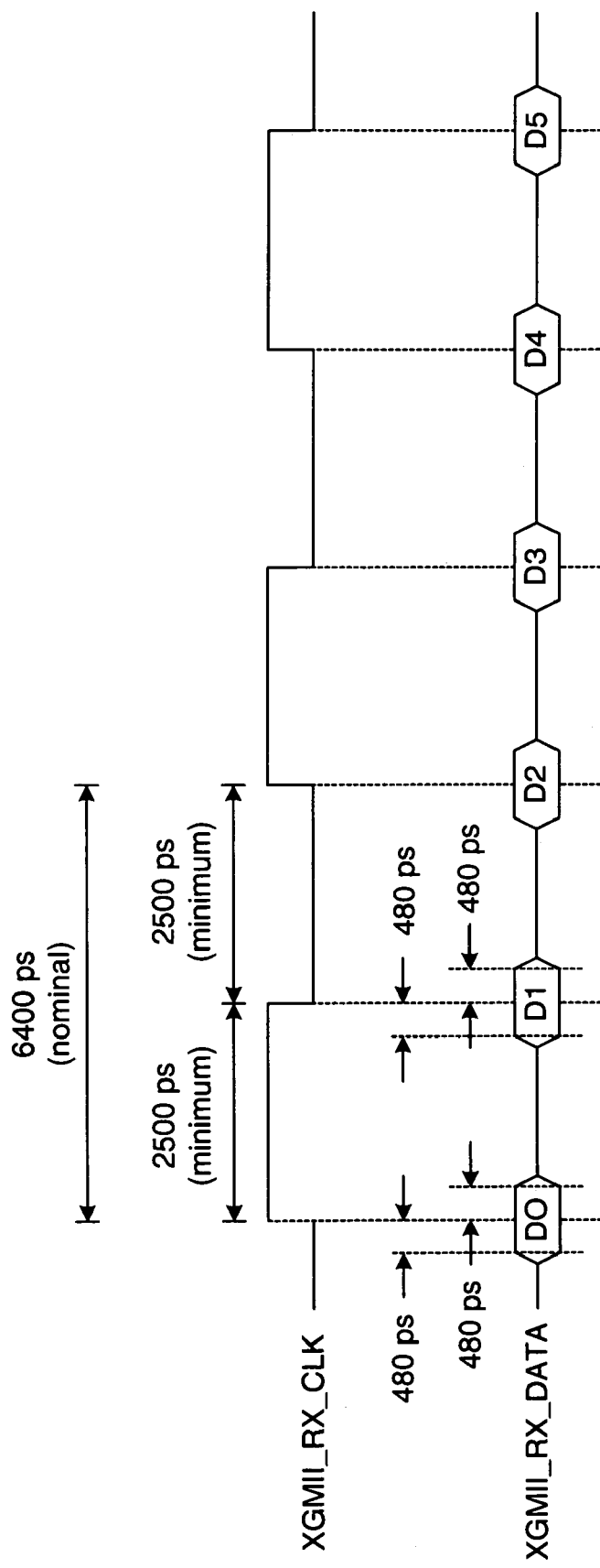
FIGS. 2–4 are waveform diagrams illustrating the timing of the clock management system of FIG. 1.
Figure 3:
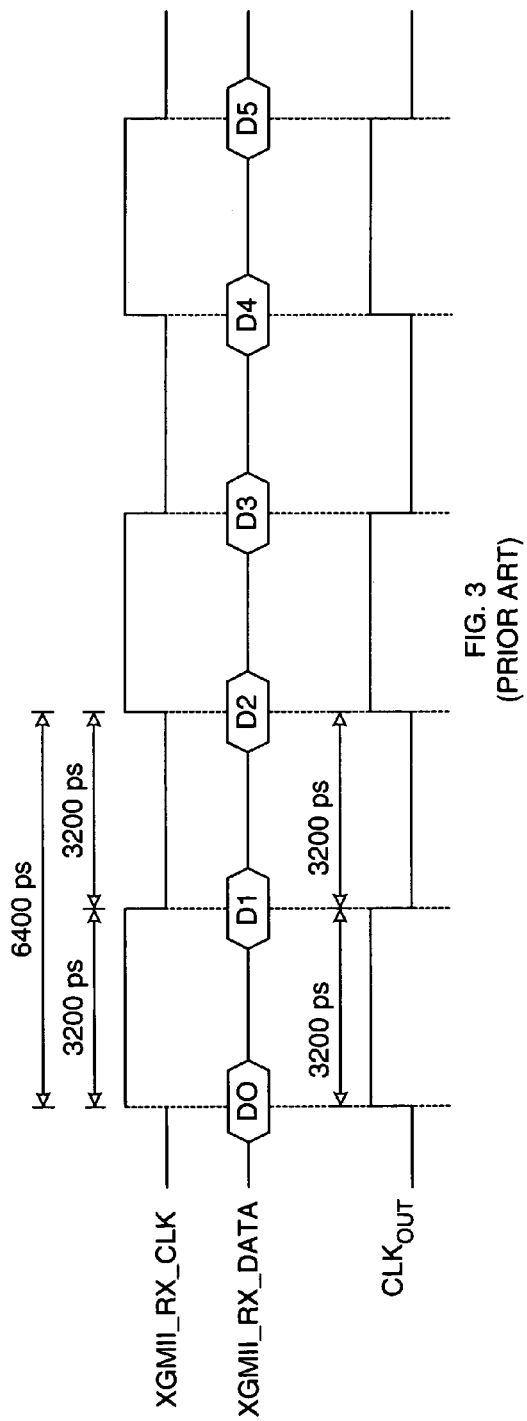
Figure 4:
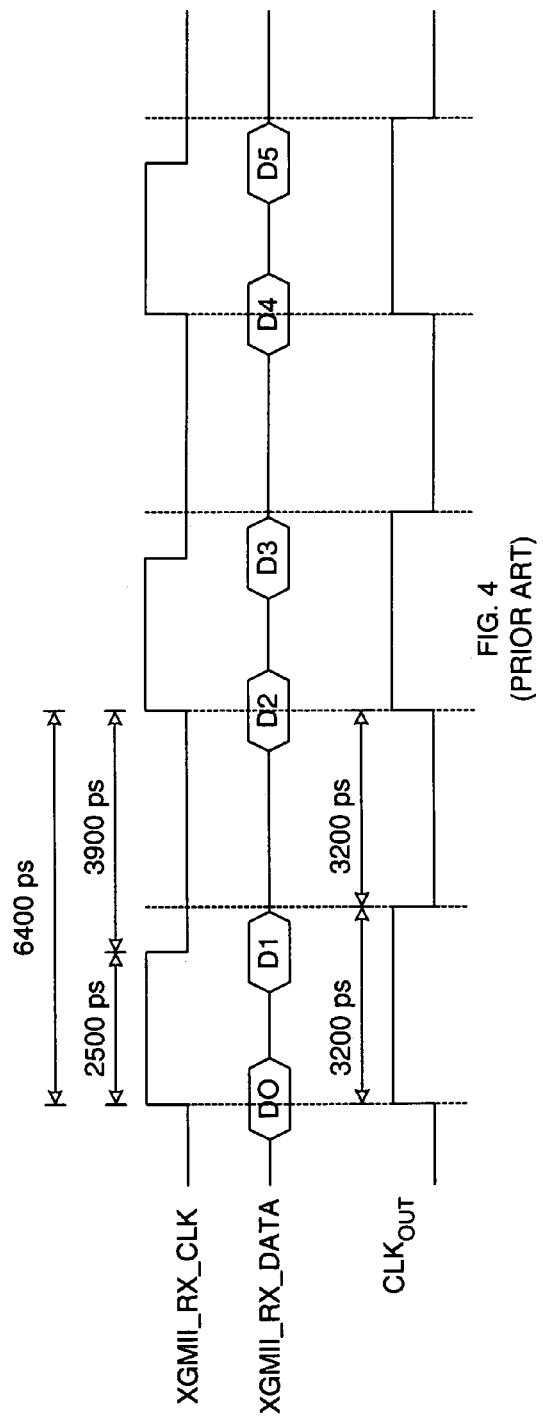

At time $T_1$, the rising edge of the $CLK_B$ signal is synchronous with the falling edge of the input clock signal XGMII_RX_CLK. As a result, the data value D1 is reliably latched into flip-flop 502 in response to the rising edge of the $CLK_B$ signal. Note that clock management system 500 corrects the deficiency of clock management system 100 illustrated by FIG. 4.

The clock management system of the present invention can also be used in other applications, such as implementing receiver clock phase alignment for DDR applications. Receiver clock phase alignment for single data rate (SDR) applications is described in Xilinx Application Note XAPP622. The receiver clock phase alignment implemented by this Xilinx Application Note is briefly described below.

Figure 7:
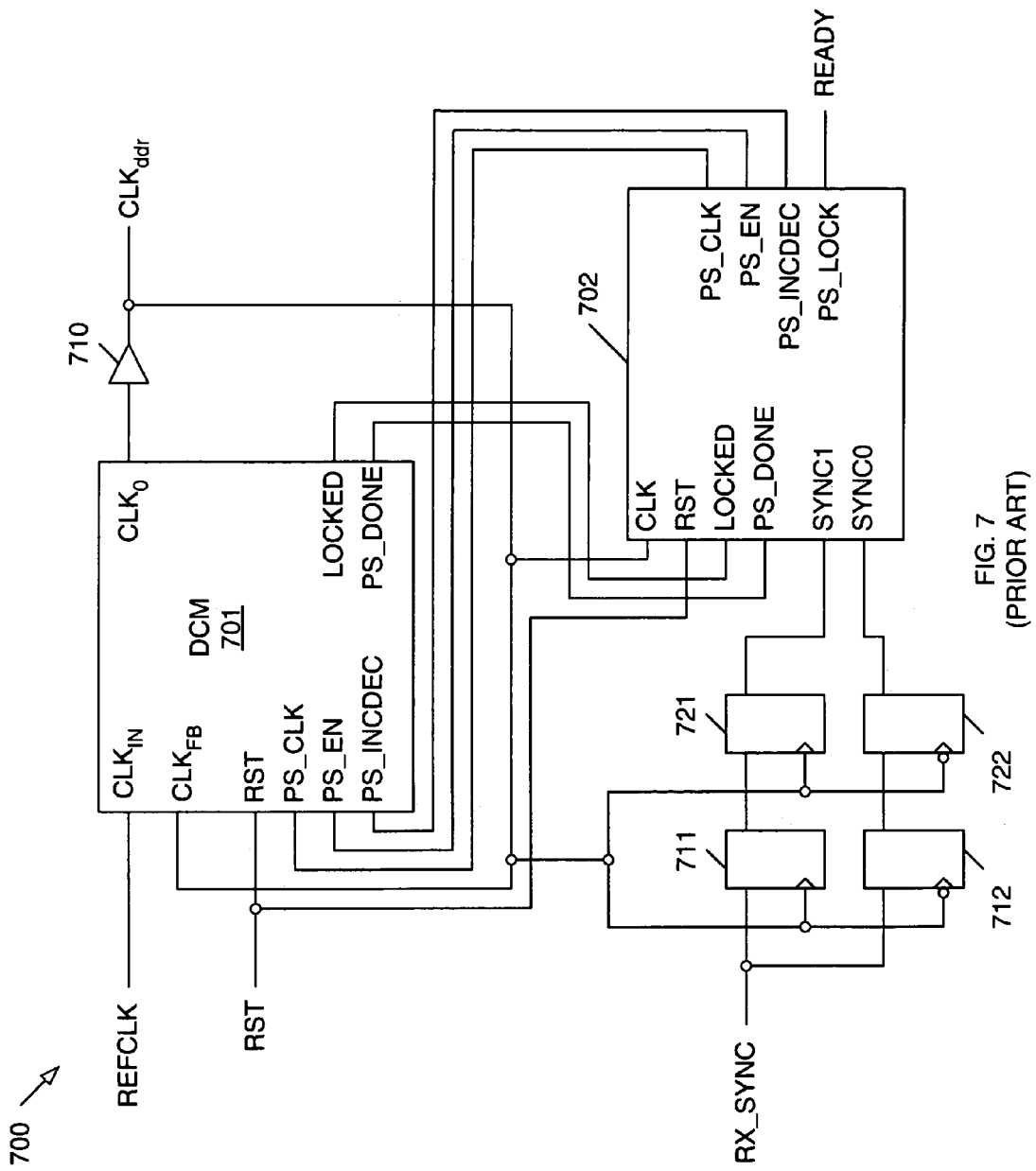
FIG. 7 is a block diagram of a conventional clock generation module used to implement receiver clock phase alignment for single data rate (SDR) applications.
Figure 8:
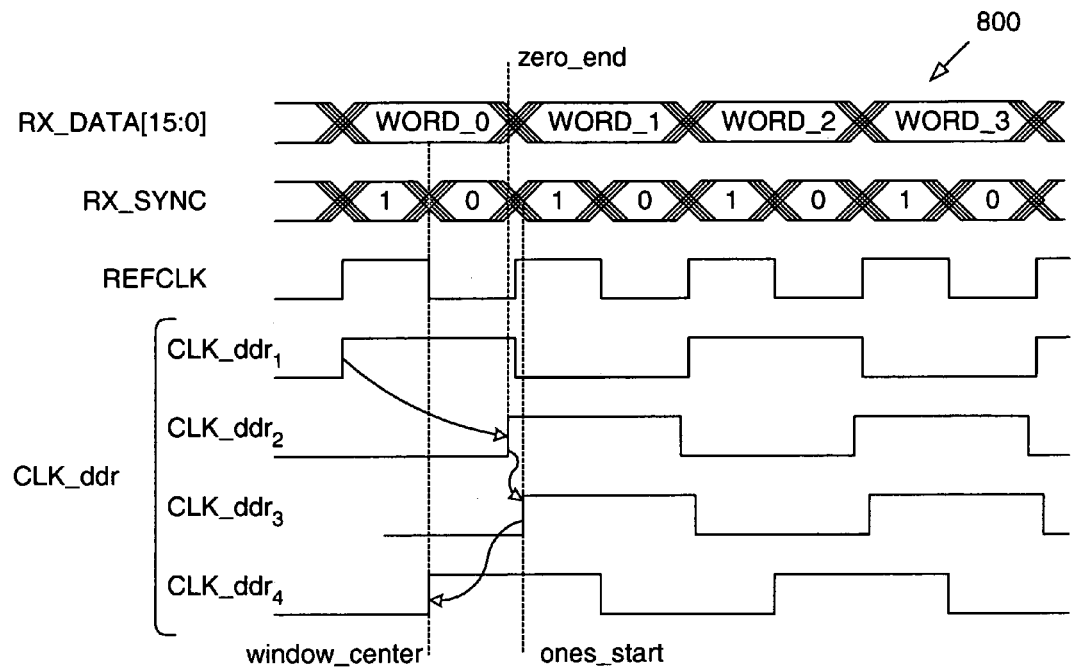
FIG. 8 is a waveform diagram illustrating the operation of the clock generation module of FIG. 7.

FIG. 7 is a block diagram of a conventional clock generation module 700 used to implement receiver clock phase alignment for SDR applications. Clock generation module 700 includes DCM 701, phase synchronization logic 702, output buffer 710, and registers 711–712 and 721–722. FIG. 8 is a waveform diagram 800 illustrating the operation of clock generation module 700. The operation of clock generation module 700 is described below with simultaneous reference to FIGS. 7 and 8.

In general, clock generation module 700 generates an output clock signal CLK_ddr in response to a synchronizing signal RX_SYNC and an input clock signal, REFCLK. DCM 701 implements a divide-by-2 attribute, such that the frequency of the CLK_ddr signal is half of the frequency of the REFCLK signal. Data values RX_data[15:0] are associated with each cycle of the REFCLK signal.

The RX_SYNC signal is a single data rate (SDR) clock signal, which has twice as many transitions as the data RX_data[15:0]. When the clock generation module 700 is reset, DCM 701 locks on the REFCLK signal, with a zero phase adjustment (see, waveform $CLK\_ddr_1$). After DCM 701 has locked, phase adjustment block 702 will increment the phase of the CLK_ddr signal (via the PS_INCDEC and PS_EN signals) until the RX_SYNC registers 711–712 and 721–722 are correctly latching steady logic "0" values at the rising and falling edges of the CLK_ddr signal. Phase adjustment block 702 increments the phase of the CLK_ddr signal until at least one of the values provided by registers 721–722 is no longer zero (see, waveform $CLK\_ddr_2$). At this time, the phase count identifies the end of a data window (zero_end).

Phase adjustment block 702 continues to increment the phase of the CLK_ddr signal until both of registers 721–722 are providing steady logic "1" values at the rising and falling edges of the CLK_ddr signal (see, waveform $CLK\_ddr_3$). At this time, the phase count identifies the beginning of the data window (ones_start).

If the phase count for the end of the data window (zero_end) is greater than 75% of the SDR period, the phase count associated with the center of the valid data window (window_center) is determined by the equation: (zero_end+ ones_start)/2−64.

If the phase count for the end of the data window (zero_end) is not greater than 75% of the SDR period, then phase adjustment block 702 continues to increment the phase of the CLK_DDR signal until the end of the next steady zero stream is reached. At this time, the phase count identifies the end of the next data window (zero_end2). The phase count associated with the center of the valid window is then determined by the equation: (ones_start+zero_end2)/2.

Phase adjustment block 702 causes DCM 701 to generate the CLK_ddr signal with a phase offset associated with the center of the valid window (waveform CLK_ddr$_4$). The data (RX_data[15:0]) is then latched in response to the rising and falling edges of the CLK_ddr$_4$ signal. However, note that only the rising edges of the CLK_ddr$_4$ signal are aligned with the center of the valid data window, while the falling edges of the CLK_ddr$_4$ signal are assumed to occur half a cycle after the rising edges. Thus, clock generation module 700 is susceptible to errors if the REFCLK signal has an asymmetrical duty cycle.

Figure 9:
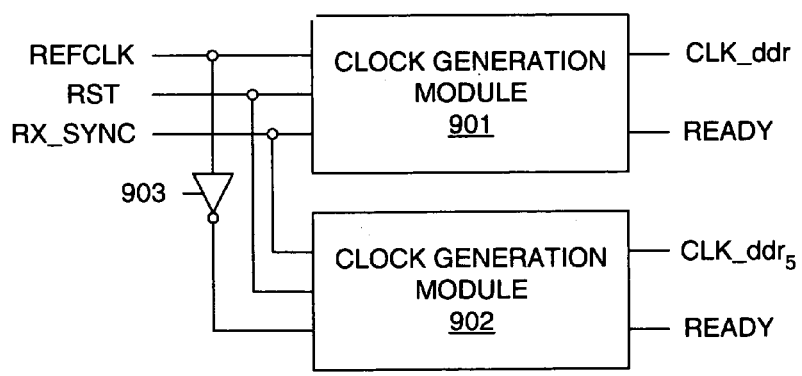
FIG. 9 is a block diagram of a clock management system in accordance with another embodiment of the present invention.

FIG. 9 is a block diagram of a clock management system 900 in accordance with one embodiment of the present invention. Clock management system 900 includes a pair of clock generation modules 901 and 902, each of which is identical to clock generation module 700 (FIG. 7), and an inverter 903. Clock generation module 901 is configured to receive the REFCLK signal, the RX_SYNC signal and the RST signal, and therefore operates in the same manner as clock generation module 700 to generate the clock signal CLK_ddr, which has edges aligned with respect to the rising edges of the REFCLK signal. The rising edges of the CLK_ddr signal are used to clock in even data words (Word 0, Word 2, etc.) in the data stream RX_data[15:0].

Clock generation module 902 is configured to receive the inverse of the REFCLK signal from inverter 903, the RX_SYNC signal and the RST signal. As a result, clock generation module 902 operates in a similar manner to clock generation module 901. However, clock generation module 902 generates a clock signal CLK_ddr$_5$, which has edges aligned with respect to the falling edges of the REFCLK signal. The rising edges of the CLK_ddr$_5$ signal are used to clock in odd data words (Word 1, Word 3, etc.) in the data stream RX_data[15:0].

Although the invention has been described in connection with several embodiments, it is understood that this invention is not limited to the embodiments disclosed, but is capable of various modifications, which would be apparent to one of ordinary skill in the art. For example, although the invention has been described in connection with the XGMII timing specification, it is understood that the present invention is applicable to any double data rate application. Moreover, although the present invention has been described in connection with a digital clock manager (DCM), it is understood that the clock management scheme of the present invention can also be used in connection with delay-locked loop (DLL) circuits or phase locked loop (PLL) circuits that are typically configured to provide an output clock signal having a nominal 50—50 duty cycle. In addition, although inverter 525 provides the inverse of the input clock signal to the second DCM 512, it is understood that the second DCM 512 may have the ability to use either the rising edges or the falling edges of the input clock signal as reference edges. In this case, the inverting buffer 525 at the input terminal of the second DCM 512 is redundant. Thus, the invention is limited only by the following claims.

I claim:

1. A method comprising:
   receiving an input clock signal having a first set of edges and a second set of edges;
   receiving a first set of data values associated with the first set of edges of the input clock signal and a second set of data values associated with the second set of edges of the input clock signal;
   providing a first clock signal with a first clock manager in response to the input clock signal, wherein the first clock signal has a third set of edges that are synchronous with the first set of edges of the input clock signal;
   storing the first set of data values in response to the third set of edges of the first clock signal;
   providing a second clock signal with a second clock manager in response to the input clock signal, wherein the second clock signal has a fourth set of edges that are synchronous with the second set of edges of the input clock signal; and
   storing the second set of data values in response to the fourth set of edges of the second clock signal.

2. The method of claim 1, wherein the first set of edges of the input clock signal are rising edges of the input clock signal, and wherein the second set of edges of the input clock signal are falling edges of the input clock signal.

3. The method of claim 1, wherein the step of providing the second clock signal in response to the input clock signal comprises inverting the input clock signal.

4. The method of claim 3, wherein the step of providing the second clock signal in response to the input clock signal further comprises comparing the second clock signal with the inverted input clock signal.

5. The method of claim 1, wherein the step of providing the first clock signal in response to the input clock signal comprises comparing the first clock signal with the input clock signal.

6. The method of claim 1, wherein the input clock signal has an asymmetric duty cycle.

7. The method of claim 6, wherein the first and second clock signals have substantially a 50—50 duty cycle.

8. The method of claim 1, wherein the first set of data values are even data words of a data stream and the second set of data values are odd data words of the data stream.

9. The method of claim 1, further comprising:
   adjusting the third set of edges of the first clock signal such that the third set of edges occur substantially at a center of a first data window associated with the first set of data values; and
   adjusting the fourth set of edges of the second clock signal such that the second set of edges occur substantially at a center of a second data window associated with the second set of data values.

10. A clock management system comprising:
    a clock input terminal configured to receive an input clock signal having a first set of edges and second set of edges;
    a data input terminal configured to receive a first set of data values associated with the first set of edges of the input clock signal and a second set of data values associated with the second set of edges of the input clock signal;
    a first clock manager coupled to the clock input terminal and configured to provide a first clock signal on a first clock terminal in response to the input clock signal, wherein the first clock signal has a third set of edges that are synchronous with the first set of edges of the input clock signal;

a first register coupled to the first clock terminal and the data input terminal, wherein the first register is configured to latch the first set of data values in response to the third set of edges of the first clock signal;

a second clock manager coupled to the clock input terminal and configured to provide a second clock signal on a second clock terminal in response to the input clock signal, wherein the second clock signal has a fourth set of edges that are synchronous with the second set of edges of the input clock signal; and a second register coupled to the second clock terminal and the data input terminal, wherein the second register is configured to latch the second set of data values in response to the fourth set of edges of the second clock signal.

11. The clock management system of claim 10, wherein the first set of edges of the input clock signal are rising edges of the input clock signal, and wherein the second set of edges of the input clock signal are falling edges of the input clock signal.

12. The clock management system of claim 10, wherein the input clock signal has an asymmetric duty cycle.

13. The clock management system of claim 12, wherein the first and second clock signals have substantially a 50—50 duty cycle.

14. The clock management system of claim 10, further comprising an inverter coupled between the clock input terminal and the second clock manager.

15. The clock management system of claim 10, wherein the first clock manager and the second clock manager each comprise at least one of a phase locked loop and a delay locked loop.

16. The clock management system of claim 10, wherein the first set of data values are even data words of a data stream and the second set of data values are odd data words of the data stream.

17. The clock management system of claim 10, further comprising:

a first phase adjustment block coupled to the first clock manager to adjust the third set of edges of the first clock signal such that the third set of edges occur substantially at a center of a first data window associated with the first set of data values; and a second phase adjustment block coupled to the second clock manager to adjust the fourth set of edges of the second clock signal such that the second set of edges occur substantially at a center of a second data window associated with the second set of data values.

18. A clock management system comprising:

means for receiving an input clock signal having a first set of edges and a second set of edges;

means for receiving a first set of data values associated with the first set of edges of the input clock signal and a second set of data values associated with the second set of edges of the input clock signal;

means for providing a first clock signal in response to the input clock signal, wherein the first clock signal has a third set of edges that are synchronous with the first set of edges of the input clock signal;

means for storing the first set of data values in response to the third set of edges of the first clock signal;

means for providing a second clock signal in response to the input clock signal, wherein the second clock signal has a fourth set of edges that are synchronous with the second set of edges of the input clock signal; and means for storing the second set of data values in response to the fourth set of edges of the second clock signal.

19. The clock management system of claim 18, wherein the first set of edges of the input clock signal are rising edges of the input clock signal, and wherein the second set of edges of the input clock signal are falling edges of the input clock signal.

20. The clock management system of claim 18, further comprising means for inverting the input clock signal.

21. The clock management system of claim 18, wherein the input clock signal has an asymmetric duty cycle.

22. The clock management system of claim 18, further comprising:

means for adjusting the third set of edges of the first clock signal such that the third set of edges occur substantially at a center of a first data window associated with the first set of data values; and means for adjusting the fourth set of edges of the second clock signal such that the second set of edges occur substantially at a center of a second data window associated with the second set of data values.

* * * * *